US012066764B2

(12) United States Patent
Tinnemans et al.

(10) Patent No.: US 12,066,764 B2
(45) Date of Patent: *Aug. 20, 2024

(54) METROLOGY APPARATUS AND METHOD FOR DETERMINING A CHARACTERISTIC OF ONE OR MORE STRUCTURES ON A SUBSTRATE

(71) Applicant: ASML Netherlands B.V., Veldhoven (NL)

(72) Inventors: Patricius Aloysius Jacobus Tinnemans, Hapert (NL); Patrick Warnaar, Tilburg (NL); Vasco Tomas Tenner, Amsterdam (NL); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/143,825

(22) Filed: May 5, 2023

(65) Prior Publication Data

US 2023/0273255 A1    Aug. 31, 2023

Related U.S. Application Data

(63) Continuation of application No. 17/460,947, filed on Aug. 30, 2021, now Pat. No. 11,709,436, which is a
(Continued)

(30) Foreign Application Priority Data

Aug. 1, 2018   (EP) ..................................... 18186825
Oct. 11, 2018  (EP) ..................................... 18199813

(51) Int. Cl.
*G03F 7/00*    (2006.01)
*G01R 31/265*  (2006.01)

(52) U.S. Cl.
CPC ... *G03F 7/706839* (2023.05); *G01R 31/2656* (2013.01); *G03F 7/70633* (2013.01)

(58) Field of Classification Search
CPC .. G01R 31/2656; G03F 7/70633; G03F 7/705
(Continued)

(56) References Cited

U.S. PATENT DOCUMENTS 6,952,253 B2   10/2005   Lof et al.
8,339,595 B2   10/2012   Den Boef
(Continued)

FOREIGN PATENT DOCUMENTS

EP   0449582 A2   10/1991
EP   0449582 A3   5/1992
(Continued)

OTHER PUBLICATIONS

International Search Report and Written Opinion of the International Searching Authority directed to related International Patent Application No. PCT/EP2019/067533, dated Aug. 13, 2019; 10 pages.
(Continued)

*Primary Examiner* — Christopher P McAndrew
(74) *Attorney, Agent, or Firm* — Sterne, Kessler, Goldstein & Fox P.L.L.C.

(57) ABSTRACT

Disclosed is a method for obtaining a computationally determined interference electric field describing scattering of radiation by a pair of structures comprising a first structure and a second structure on a substrate. The method comprises determining a first electric field relating to first radiation scattered by the first structure; determining a second electric field relating to second radiation scattered by the second structure; and computationally determining the
(Continued)

interference of the first electric field and second electric field, to obtain a computationally determined interference electric field.

20 Claims, 4 Drawing Sheets

Related U.S. Application Data continuation of application No. 16/527,142, filed on Jul. 31, 2019, now Pat. No. 11,125,806.

(58) Field of Classification Search
USPC .................................................. 324/754.23
See application file for complete search history.

(56) References Cited

U.S. PATENT DOCUMENTS

| | | |
|---|---|---|
| 8,891,061 B2 | 11/2014 | Leewis et al. |
| 9,632,039 B2 | 4/2017 | Den Boef et al. |
| 10,809,628 B2 | 10/2020 | Den Boef et al. |
| 10,831,108 B2 | 11/2020 | Marciano et al. |
| 11,125,806 B2 | 9/2021 | Tinnemans et al. |
| 2004/0119970 A1 | 6/2004 | Dusa et al. |
| 2010/0328655 A1* | 12/2010 | Den Boef ............ G03F 7/7015 356/237.5 |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0114087 A1* | 5/2013 | Deck ...................... G01D 5/268 356/486 |
| 2016/0161863 A1 | 6/2016 | Den Boef et al. |
| 2018/0011029 A1* | 1/2018 | Tinnemans ......... G03F 7/70616 |
| 2020/0041563 A1 | 2/2020 | Tinnemans et al. |
| 2021/0389365 A1 | 12/2021 | Tinnemans et al. |

FOREIGN PATENT DOCUMENTS

| | | |
|---|---|---|
| EP | 1628164 A2 | 2/2006 |
| EP | 1628164 B1 | 10/2010 |
| EP | 3293574 A1 | 3/2018 |
| EP | 3480554 A1 | 5/2019 |
| JP | 3029133 B2 | 4/2000 |
| KR | 2017-0015453 A | 2/2017 |
| KR | 2017-0044720 A | 4/2017 |
| NL | 2021602 A | 10/2018 |
| WO | WO 2011/012624 A1 | 2/2011 |
| WO | WO 2015/018625 A1 | 2/2015 |
| WO | WO 2017/186483 A1 | 11/2017 |

OTHER PUBLICATIONS

Ikram, M. and Hussain, G., 1999. Michelson interferometer for precision angle measurement. Applied optics, 38(1), pp. 113-120. (Year: 1999).

Lawall, J. and Kessler, E., 2000. Michelson interferometry with 10 pm accuracy. Review of Scientific Instruments, 71 (7), pp. 2669-2676. (Year: 2000).

Pfortner, Andreas, and Johannes Schwider. "Red-green-blue interferometer for the metrology of discontinuous structures." Applied optics 42.4 (2003): 667-673. (Year: 2003).

* cited by examiner

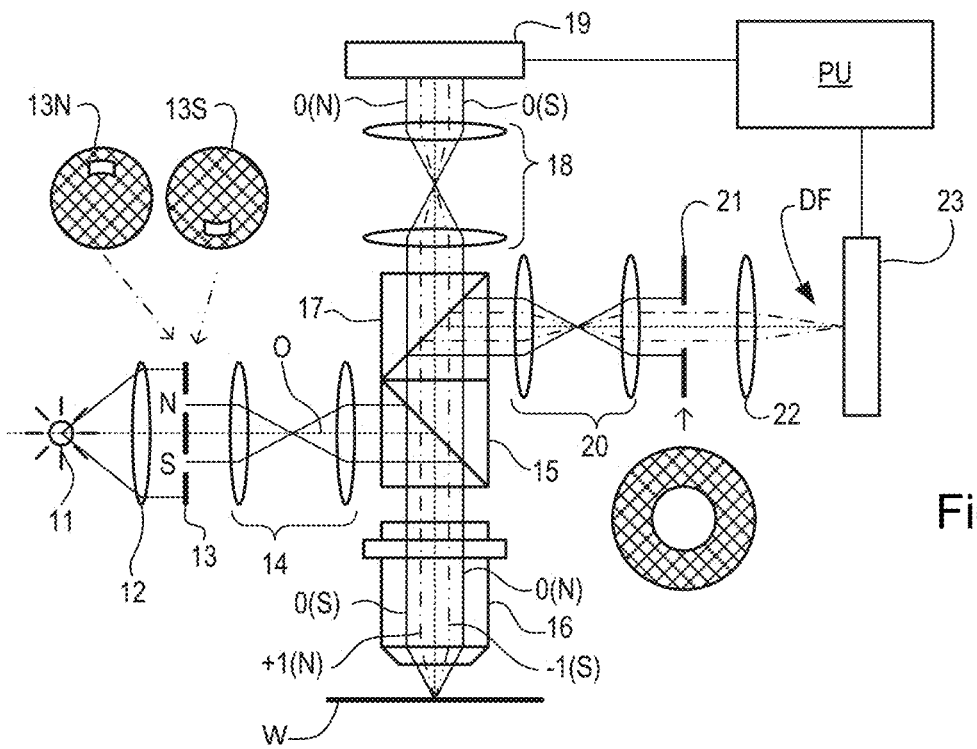
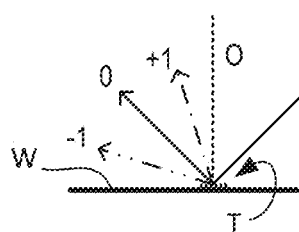
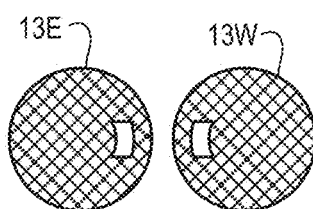
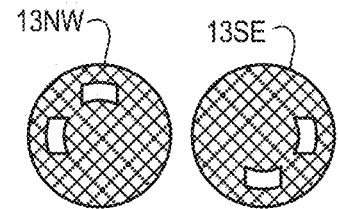
Fig. 5(b)    Fig. 5(c)    Fig. 5(d)
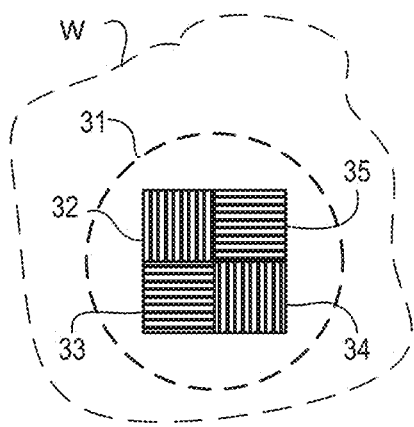
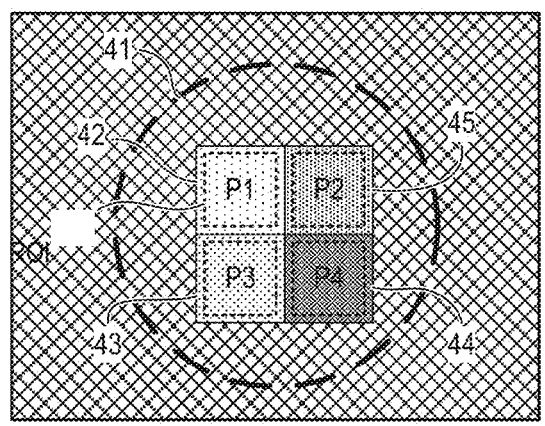
Fig. 6(a)    Fig. 6(b)

METROLOGY APPARATUS AND METHOD FOR DETERMINING A CHARACTERISTIC OF ONE OR MORE STRUCTURES ON A SUBSTRATE

CROSS REFERENCE TO RELATED APPLICATIONS

This application is a continuation application of U.S. patent application Ser. No. 17/460,947, filed on Aug. 30, 2021, which is a continuation of U.S. application Ser. No. 16/527,142, filed on Jul. 31, 2019, now U.S. Pat. No. 11,125,806, Issued Sep. 21, 2021, which claims priority to European Patent Application 18199813.9, filed on Oct. 11, 2018, and European Patent Application 18186825.8, filed on Aug. 1, 2018, the entire contents of all of which are incorporated herein by references.

FIELD

The present invention relates to a metrology apparatus or an inspection apparatus for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

When measuring thick stacks, where there may be a significant distance between the two layers being measured. This can make overlay determination using intensity asymmetry unreliable because the images obtained using the −1st and the +1st diffraction order intensities show no region of significant stable intensity from which an estimation (e.g., average) can be taken. This can be addressed by determining overlay using a pupil plane image, but this requires very large targets and separate acquisitions for each grating pair target area.

SUMMARY

It is an object to provide an effective an efficient solution for an inspection or metrology apparatus that solves one or more of the above discussed problems or limitations.

Embodiments of the invention are disclosed in the claims and in the detailed description.

In a first aspect of the invention there is provided a method for obtaining a computationally determined interference electric field describing scattering of radiation by a pair of structures comprising a first structure and a second structure on a substrate. The method comprises determining a first electric field relating to first radiation scattered by the first structure; determining a second electric field relating to second radiation scattered by the second structure; and computationally determining the interference of the first electric field and second electric field, to obtain a computationally determined interference electric field.

Also provided is a processing apparatus and computer program product operable to carry out the method of the first aspect, and an inspection apparatus comprising such a processing apparatus.

BRIEF DESCRIPTION OF THE DRAWINGS

Embodiments of the invention will now be described, by way of example only, with reference to the accompanying schematic drawings, in which:

FIGS. 5(a)-5(d) comprise 5(a) a schematic diagram of a dark field scatterometer for use in measuring targets according to embodiments of the invention using a first pair of illumination apertures, 5(b) a detail of diffraction spectrum of a target grating for a given direction of illumination 5(c) a second pair of illumination apertures providing further illumination modes in using the scatterometer for diffraction based overlay measurements and 5(d) a third pair of illumination apertures combining the first and second pair of apertures;

FIGS. 6(a)-6(b) depict 6(a) a known form of multiple grating target and an outline of a measurement spot on a substrate; and 6(b) an image of the target obtained in the scatterometer of FIG. 5.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
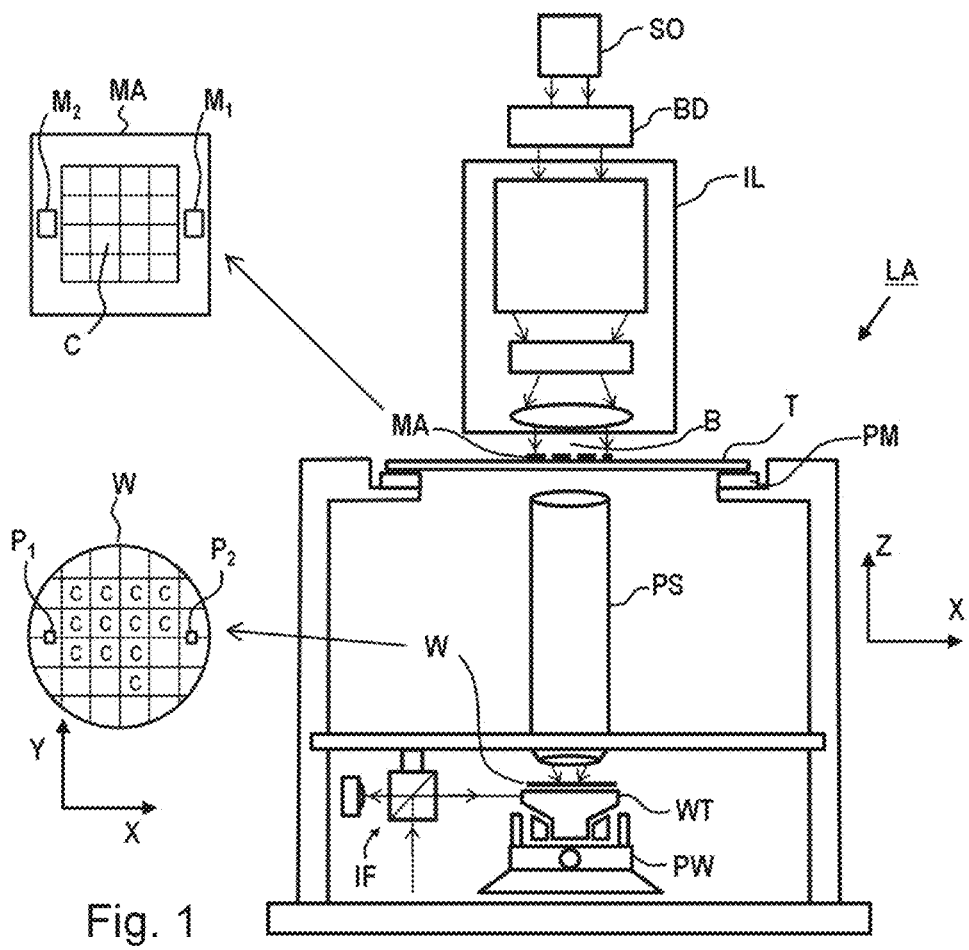
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
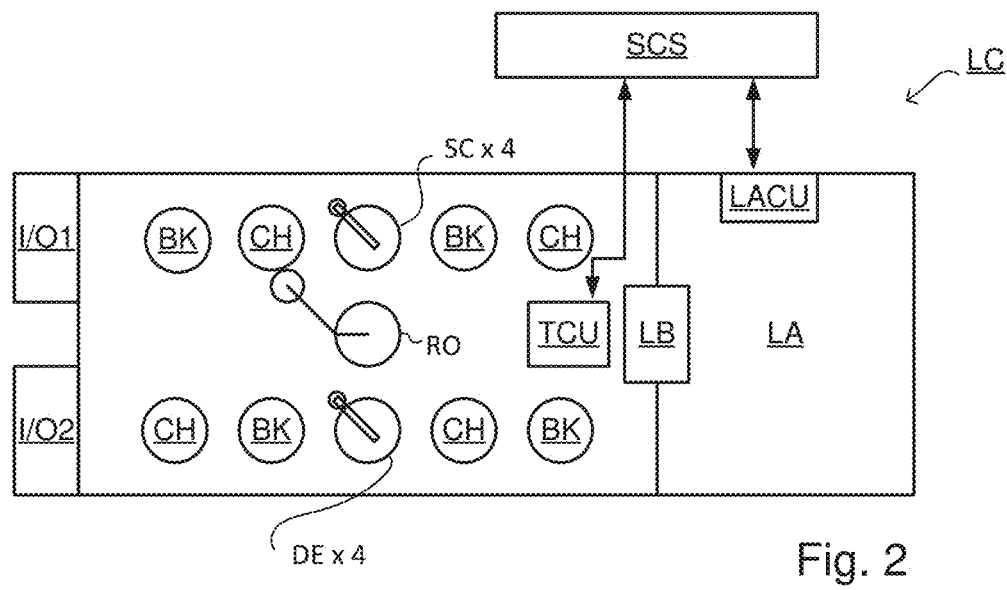
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
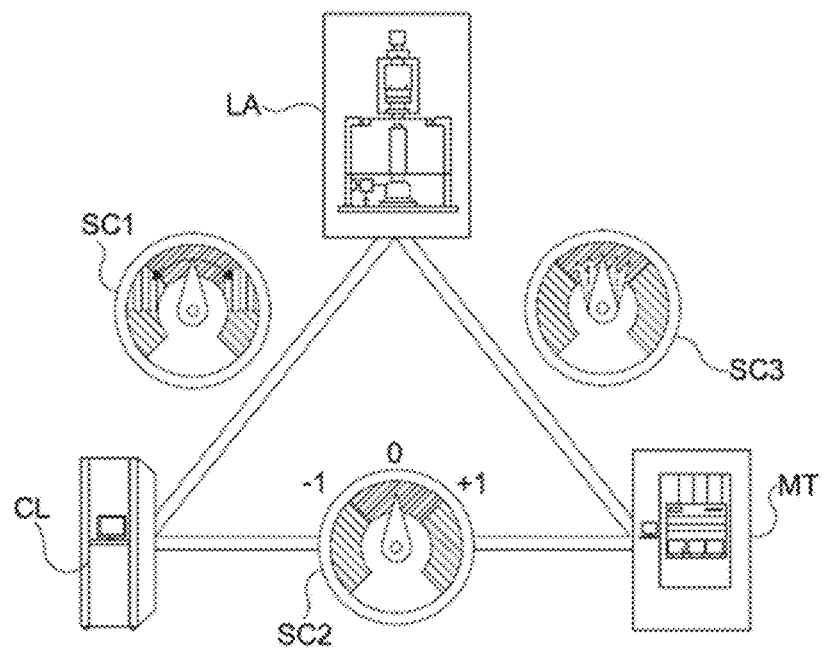
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
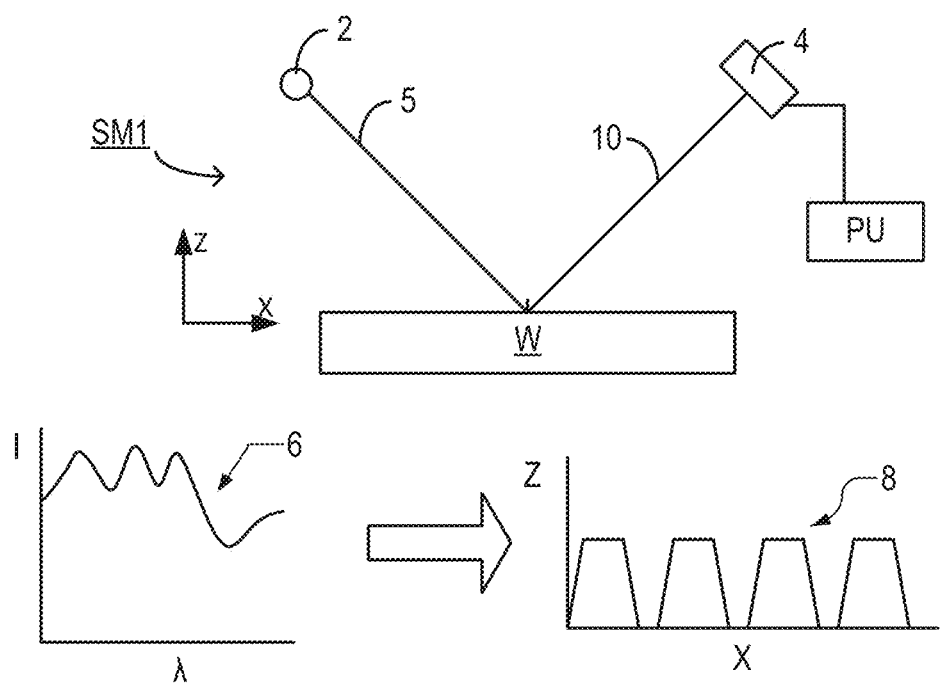
FIG. 4 illustrates an inspection apparatus according to an embodiment of the invention.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

A metrology apparatus suitable for use in embodiments of the invention is shown in FIG. 5(*a*). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 5(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 6(a) depicts a target structure or composite target formed on a substrate according to known practice. The target structure in this example comprises four targets (e.g., gratings) 32 to 35 positioned closely together so that they will all be within a measurement spot 31 formed by the metrology radiation illumination beam of the metrology apparatus. The four targets thus are all simultaneously illuminated and simultaneously imaged on sensors 19 and 23. In an example dedicated to measurement of overlay, targets 32 to 35 are themselves composite gratings formed by overlying gratings that are patterned in different layers of the semi-conductor device formed on substrate W. Targets 32 to 35 may have differently biased overlay offsets in order to facilitate measurement of overlay between the layers in which the different parts of the composite gratings are formed. The meaning of overlay bias will be explained below with reference to FIG. 7. Targets 32 to 35 may also differ in their orientation, as shown, so as to diffract incoming radiation in X and Y directions. In one example, targets 32 and 34 are X-direction gratings with biases of the +d, −d, respectively. Targets 33 and 35 are Y-direction gratings with offsets +d and −d respectively. Separate images of these gratings can be identified in the image captured by sensor 23. This is only one example of a target structure. A target structure may comprise more or fewer than 4 targets, or only a single target.

FIG. 6(b) shows an example of an image that may be formed on and detected by the sensor 23, using the target of FIG. 6(a) in the apparatus of FIG. 5, using the aperture plates 13NW or 13SE from FIG. 5(d). While the pupil plane image sensor 19 cannot resolve the different individual targets 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of targets 32 to 35. In this way, the images do not have to be aligned very precisely at a specific location within the sensor frame, which greatly improves throughput of the measuring apparatus as a whole.

Once the separate images of the targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

In one embodiment of the metrology apparatus (e.g., scatterometer), the metrology apparatus is adapted to measure the overlay of two misaligned gratings or periodic structures by measuring asymmetry in the reflected spectrum and/or the detection configuration, the asymmetry being related to the extent of the overlay. A similar method may be used to measure focus on special targets which are formed with a focus dependent asymmetry. In the overlay case, the two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Measurement of overlay targets using diffractive metrology methods such as those described above is more accurate for thinner stacks, where the distance (in the z-direction perpendicular to the substrate plane) between the two layers being measured is not too large. Measurement of thicker stacks presents greater difficulty, particularly were the metrology apparatus is such that the measurement radiation is incident on the target at a non-normal angle. Due to the non-normal propagation of light, along multiple diffraction paths through a target of finite thickness between top and bottom gratings, the gratings will not be properly aligned and therefore effectively displaced relative to each other. These displacements are smeared out due to the illumination arriving from multiple angles within a finite area aperture. As a consequence, different points in the image plane (the plane imaged by the detector—e.g., detector 23 in FIG. 3) carry different information regarding intersections of the grating images, and thus stack sensitivity becomes a rapidly varying function of position in the image plane. In a thin target, this effect only affects the image edge. Therefore, the Region of Interest (ROI) is identified as an area away from the edge within the image, where the measured intensity shows very little spatial variation. However, with thicker stacks, this effect occurs not only at the edge of the target image, but throughout the whole target image. The average asymmetry signal over the image has very little stack sensitivity (sensitivity of the measurement to overlay) due to rapid sign variation of the stack sensitivity within any chosen ROI area, while individual pixels have considerably greater stack sensitivity. This results in a very inaccurate overlay estimation. Stack sensitivity describes the change in asymmetry signal between the sub-targets, normalized by the average of their intensity scaled by the bias target d. In a specific example, normalized stack sensitivity K1/S is described by:

$$K_1/S = \frac{A_{+d} - A_{-d}}{I_{av} 2/d}$$

where +d and −d are the imposed sub-target biases (having magnitude d), $A_{+d}$ is an asymmetry measurement (intensity difference) from complementary images of the +d sub-target and $A_{-d}$ is an asymmetry measurement (intensity difference) from complementary images of the −d sub-target. $I_{av}$ is the average of the intensity measurements of both sub-targets +d, −d, for both the +1 and −1 diffraction orders.

For thick stacks there is no sufficiently large ROI for which an average will result in a strong and stable stack sensitivity. Additionally, current image recognition algorithms work by identifying uniform regions, but in thick stacks the boundaries around the target become smooth and washed out, making ROI detection more difficult.

Figure 7A:
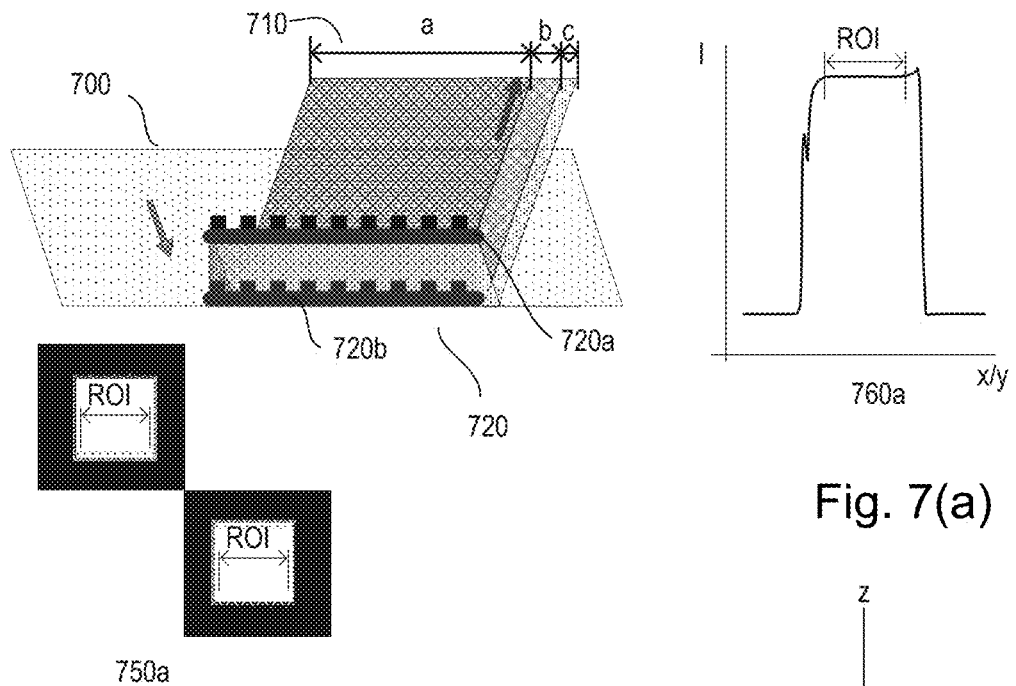
FIGS. 7(a)-7(b) show exemplary optical paths of measurement radiation through 7(a) a thin target and 7(b) a thick target, and corresponding images and intensity plots.
Figure 7B:
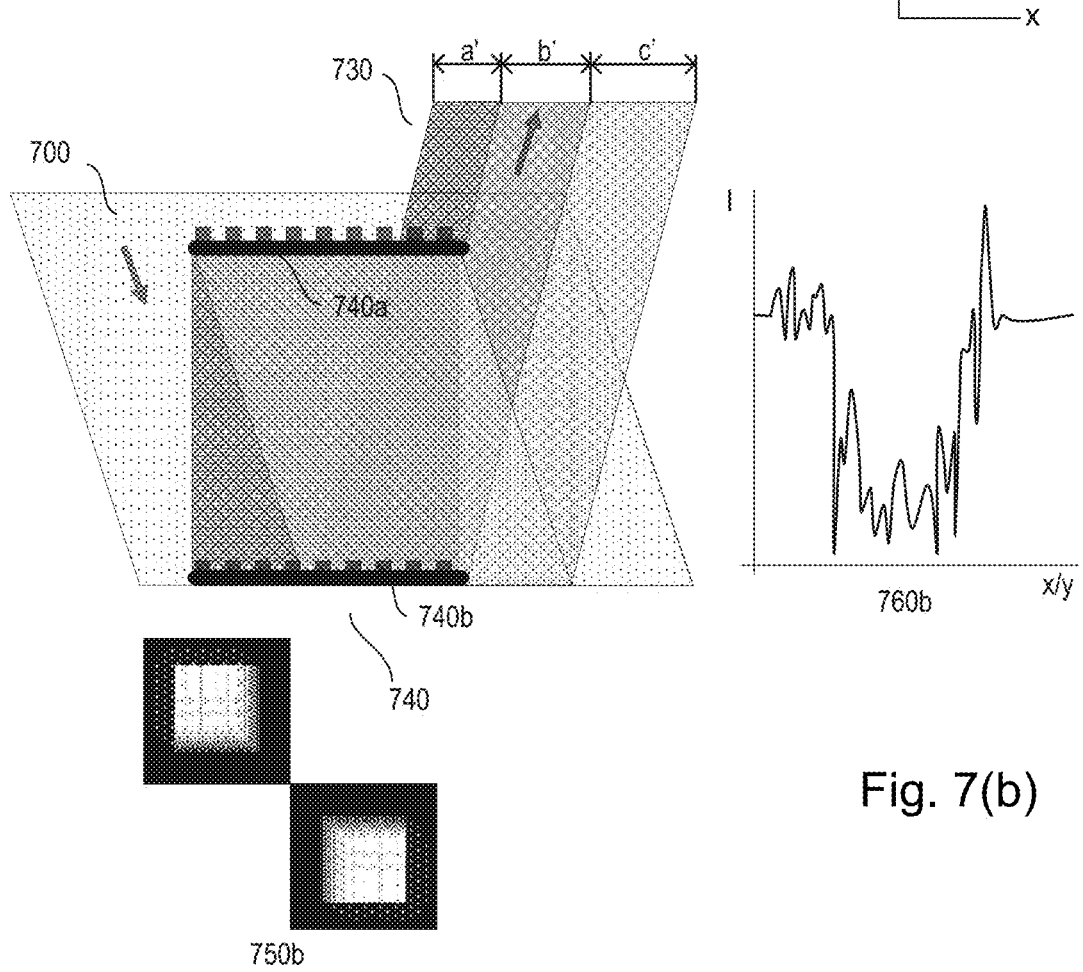

FIG. 7 illustrates this effect. FIG. 7(a) shows incident measurement radiation 700 and scattered radiation 710 following illumination of a pair of structures comprising a top grating 720a and bottom grating 720b arranged to form a thin grating pair or target 720. For clarity, only a single path is shown, although there will be multiple paths in reality. FIG. 7(b) shows incident measurement radiation 700 and scattered radiation 730 following illumination of pair of structures forming which comprising a top grating 740a and bottom grating 740b arranged to form a thick grating pair or target 740. In each case, the resultant captured image 750a, 750b and a corresponding graph 760a, 760b of intensity (e.g., of a single diffraction order) against position (in x or y) for the measured scattered radiation is shown.

In both drawings, for clarity, only a single path is shown, although there will be multiple paths in reality. Many different optical paths arise because of successive diffraction/reflection/transmission events at the top grating 720a, 740a, then at the bottom grating 720b, 740b, and again at the top grating 720a, 740a, the radiation possibly diffracting at different angles at each diffraction event. Therefore, optical paths inside the target, other than that shown, exist and behave similarly (i.e. there will be regions with no overlap, regions with top-bottom overlap, and regions with top-bottom-top overlap). Also, there will be some radiation reflecting from the top grating, resulting in a further region which partially overlaps with region a, a', and which carries overlay signal only in the overlap region.

In FIG. 7(a), the scattered radiation 710 has been divided into regions labelled a, b and c depending on the path of the radiation through the target. The largest region, labeled a, results from measurement radiation 700 having taken a path through the top grating 720a, onto the bottom grating 720b and back through the top grating 720a. As the radiation in this region has been subject to the same scattering structures and is relatively large with relation to the image, its intensity will be relatively stable over the region, as shown by the region of the image 750a and graph 760a labeled ROI. The region labeled b results from measurement radiation 700 having taken a path through the top grating 720a, onto the bottom grating 720b, but not through the top grating 720a again. As both of these regions a, b are scattered by both the top grating 720a and bottom grating 720b, they will each contain overlay information. The region labelled c has been scattered by the top grating 720a only, and therefore comprises no overlay information.

FIG. 7(b) shows the equivalent situation for a thick grating pair or target. It can be seen that the region a' is much smaller than the equivalent region a in FIG. 7(a). Also, the region c', which comprises no overlay information, is much larger than the equivalent region c in FIG. 7(a). Due to the aperture being finite in size, the incident measurement radiation 700 arrives at the target at multiple angles of incidence, meaning that the resultant image is smeared (spread out) along the propagation direction of the measurement radiation, the distance between the gratings exacerbating this spreading. The multiple optical paths (due to multiple diffraction angles) following each diffraction event further complicates the image of the target. The result of this is illustrated by the image 750b, which shows this spreading out of the intensity in the x/y diagonal, and in the graph 760b where it can be seen that there is no region of stable intensity, and therefore no good ROI from which an average can be taken. Note that the direction of spreading in image 750b is dependent on the metrology apparatus and aperture configuration, for other metrology apparatuses and aperture configurations, the spreading may be in a different direction; for example along the grating axis (e.g., x-axis for an x-grating).

To address this, a method is proposed whereby overlap, and therefore interference between a first structure or first grating (e.g., in a first layer: a bottom grating) and a second structure or second grating (e.g., in a second layer: a top grating) is created computationally, rather than by measuring actual interference of radiation which has passed through both gratings. This is possible if the full field (at least phase and amplitude, possibly also polarization and/or coherence (temporal and/or spatial)) of the radiation passing through the top grating and passing through the bottom grating is known. This information is now available, for example, when Computational Imaging (CI) techniques are used, such as those described in Patent applications EP17194905.0, filed Oct. 5, 2017, EP17199764.6 filed Nov. 2, 2017, EP17206967.6 filed Dec. 13, 2017 or Patent application EP18158745.2 filed Feb. 27, 2018 which are incorporated herein by reference. In CI, the high-quality and high-NA imaging optics of a typical metrology device are replaced by a simple single lens, for example, which creates a relatively distorted and/or aberrated image of the metrology target(s) on an image sensor. A near-perfect image of metrology targets can be retrieved when the full field (both intensity and phase) of the light on the sensor is known by direct phase resolved measurements (e.g. holographic microscopy) or by phase retrieval methods (phase is retrieved from intensity measurements only). In phase resolved measurements, the full electric field on the sensor can be observed by using a holographic setup and applied knowledge regarding the imaging system. Phase retrieval methods may use a phase retrieval algorithm and prior knowledge relating to the imaging system and/or the metrology targets. Examples of suitable phase retrieval methods have been described in the aforementioned patent applications EP17194905.0, EP17199764.6 and EP17206967.6.

Knowing both the amplitude and phase of the light diffracted by the target, enables computation of overlay, for example, even when the diffracted light from the bottom grating and from top grating only partially overlap, do not overlap at all from a geometric point of view (but still interact due to the size of the (partial) coherent point spread function), or do not overlap at all from a geometric point of view (and also do not interact directly due to the size of the (partial) coherent point spread function). In the latter case, an absolute calibration of the measured phase information is required, to enable computation of the gratings' relative position (i.e., overlay).

Throughout the specification, the term "overlap" (in the context of whether gratings are overlapping (wholly or partially) or not) should be understood to be with respect to the angle of incidence (path direction) of the measurement illumination (i.e., whether they overlap in the illumination path of the measurement illumination). For example, a top-down view of the wafer might show a pair of structures which do not overlap; however, due to the distance between the gratings and the angle of illumination both structures may effectively be completely overlapping in the detected image. In such an example, the structures are to be considered to be overlapping within the context of this disclosure. As such, the degree of overlap between grating pairs will be angle of incidence and stack dependent.

A method may comprise separately detecting at least a portion of first radiation (i.e., radiation scattered by the first structure) and at least a portion of second radiation (i.e., radiation scattered by the second structure). This may be achieved in a single acquisition, e.g., by imaging the first radiation and second radiation on separate regions of a detector (or on separate detectors) simultaneously. The method may comprise obtaining an image of at least one target, comprising at least a first region where the radiation has only been scattered by the bottom grating and at least a second region where the radiation has only been scattered by the top grating (alternatively the top grating and bottom grating scattering may be captured in separate images). The method then comprises determining at least the phase (and possibly also other characteristics such as amplitude and/or polarization and/or coherence) of the radiation for these regions such that a description of a first electric field describing the first radiation scattered only by the first (e.g., bottom) grating and of a second electric field describing the second radiation scattered only by the second (e.g., top) grating is obtained. The first electric field and second electric field can then be propagated and interfered computationally to obtain a computationally determined interference electric field comprising a description of the interference electric field (i.e., a computationally derived electric field resultant from interference of the first electric field and second electric field). It can be seen that the FIG. 7 example does not actually show a region scattered only by the bottom grating.

There are number of ways that such a region may be obtained in the image. The bottom grating could be made larger and/or positioned with an offset (in a plane parallel with the substrate plane) with respect to the top grating (e.g., so that the gratings only partially overlap or do not overlap at all) and/or a larger angle of incidence (with respect to normal) could be used.

Conventional Illumination of a stacked grating structure (overlay target) results in scattering of the illuminating radiation by the target. The resulting diffraction orders in the scattered radiation comprise information describing the overlay between the two gratings of which each target is comprised. The scattered light field consists of a diffraction from the top grating (described by a top grating diffracted field $\underline{E}_t$) and from the bottom grating (described by a bottom grating diffracted field $\underline{E}_b$). Note that both of these diffracted fields are described by complex numbers, which is also signified by their underscore notation. It will be appreciated that extension to the full vectorial scattering case is trivial for someone knowledgeable in the art. More specifically, the full field E at the detection plane will comprise the interference of the top grating and bottom grating diffracted fields i.e., the sum $\underline{E}=\underline{E}_t+\underline{E}_b$ (in a conventional ideal measurement ignoring higher order scattering inside of the target).

Therefore it is proposed, in one embodiment, that the interference field can be computationally derived by summing together the first electric field and second electric field. Other, more complicated methods of combining the electric fields (i.e., modelling their interference) are also possible, as will be apparent to the skilled person. Such modelling may use a scattering model, or an inverse scattering model. For example, such methods may account for the higher order scattering within the target.

The above description is provided in the context of addressing the problem of measuring thick stacks (i.e., a large separation in the z direction), particularly when using diffraction based overlay techniques. However, the method may be useful in a number of other situations, such as when the two gratings are separated in the substrate plane (in x and/or y) for example. The following arrangements can be envisaged:

The gratings completely overlap.

The gratings partially overlap.

The gratings do not overlap, but their separation distance (e.g., in the substrate plane) is small, where small in this context can be taken to mean that the separation distance (in the substrate plane) is not large with respect to the spatial coherence length of the illumination light; more particularly that the separation distance is not greater than the spatial coherence length.

The gratings do not overlap, their separation distance is large, where large in this context means that the separation distance (in the substrate plane) is large with respect to the spatial coherence length of the illumination light; more particularly that the separation distance is greater than the spatial coherence length, and there is/are no intervening structure(s).

The separation distance between the top and bottom gratings is large, but there is at least one auxiliary reference structure (e.g., reference grating) between them, such that the distance between each grating and its adjacent reference structure is small, as is the distance between adjacent references structures (where there is more than one), with small being as defined in arrangement 3) above.

Note that the spatial coherence length is related to the size of the point spread function of the optics; typically this number will be of the order of ten times the wavelength divided by the numerical aperture. The principles described herein can be extended to any arrangement where there is a well-defined phase relationship between the radiation scattered by the first grating and the radiation scattered by the second gratings such that the fields which are to be computationally interfered are coherent (or at least sufficiently coherent). In the examples of 1), 2) and 3) above, the phase relationship will be inherently sufficiently defined due to the close proximity of the gratings. In the example of 4) this is not necessarily so (particularly when using a dark-field detection scheme), as there will be a gap between the illumination from the first and second gratings, as detected on the sensor, where the intensity is zero. This means that the phase relation may be ill-defined for such an arrangement. Arrangement 5) addresses this by restoring the phase relation between the first and second grating. It does this by effectively bridging the gap by means of placing one or more auxiliary reference gratings between the first and second gratings. Note that these reference gratings may comprise the same pitch as the top and bottom gratings (due to dark-field detection using limited numerical aperture detection optics). Another method for bridging the gap on the sensor may comprise performing the measurements with some deliberate defocus (which can be computationally refocussed using computational imaging methods). Such a defocus will widen the scattered radiation spread (area) on the sensor, effectively increasing the spatial coherence length.

In an embodiment, the first and second gratings may be formed in the same layer (i.e., not separated in the z-direction). Depending on the largest area which can be exposed in a single exposure of a lithographic apparatus (the maximum scanning field area), it may be that a single circuit/device layer is exposed in two (or more) exposures stitched together (a stitched die). To measure the alignment of the two sub-fields of a stitched die, a stitched grating pair or stitched target may be formed, which may comprise a first grating on a first sub-field (e.g., patterned from a first reticle) and a second (complementary) grating on a second sub-field (e.g., patterned from a second reticle). The relative positioning of the complementary patterns can then be measured to provide a measure of the relative positioning of the two sub-fields (the "stitched overlay"). Note that "stitched overlay" in this context is not conventional overlay in that it is not measuring the alignment of structures in different layers. However, the term "overlay" in the context of this disclosure should be understood to include this stitching overlay in addition to conventional overlay; i.e., the term overlay encompasses a measure of the relative lateral displacement between the first structure and second structure regardless of whether these structures are comprised in different layers or the same layer. It will be further appreciated that, while typically the two gratings of a stitched target are formed overlapping (analogously to a conventional overlay target) in a small region where the sub-fields overlap, the methods described herein enable other arrangements, such as described by arrangements 1), 2), 3) and 5) above. This means that the stitched die can be formed from non-overlapping sub-fields (or the amount of overlap can be reduced) thereby increasing the effective maximum size of the stitched die. The two gratings may then be computationally placed (virtually) on top of each other to mitigate the problem of extremely weak asymmetry signals (a problem when the resist layer is very thin, e.g., in EUV lithography; thicker resists will not necessarily result in such weak signals), in which case the signal is measurable only if there is a vertical separation between the two gratings. For example, the electric fields are computationally interfered, (e.g., by means of a summation for example), but with a location shift defined for (at least) one grating, such that it is located "virtually" on top of the other grating. Then the fields are summed for each location and the intensity computed.

In a specific embodiment, the stitching target may comprise two (sub)targets per direction (e.g., arranged in quadrants in a form similar to a diffraction based overlay (DBO) target. The two (sub)targets may comprise, per direction, a first exposure grating and a second exposure grating, with one (or both) of the first exposure grating and a second exposure grating having a (different) bias to enable the stitched overlay to be calculated while correcting for other target asymmetries using methods similar to those used in DBO metrology.

By using this method, an asymmetry based parameter of interest (in particular overlay including stitched overlay) can be calculated. Other than the step of computationally deriving the interference electric field rather than sensing an actual interference field directly using a sensor, otherwise conventional methods for determining overlay may be employed. One such conventional method, for example, may comprise determining (computationally) the intensities of corresponding diffraction orders (for example +1 order and −1 order although a pair of higher orders can also be used) and then the intensity asymmetry (e.g., their difference) from the computationally determined interference electric field. More specifically, intensity asymmetry may be measured in this way from two or more pairs of structures (e.g. two grating pairs or targets with a different imposed bias), so as to determine the overlay sensitivity (the relationship between intensity asymmetry and overlay). Such methods are known and are described, for example, in WO2015/018625, incorporated herein by reference. However, the methods also allow improved methods for calculating overlay to be employed.

Another method may calculate overlay based on the relative phase differences in the computationally determined interference electric field. This is achieved by performing a phase sensitive (full-field) measurement, and determining the overlay directly from the phase sensitive measurement values. More specifically, the overlay can be calculated from a determination of the phase delay contribution resulting from overlay via a determination of field asymmetry in the computationally interfered higher diffraction orders, rather than only intensity asymmetry. It should be appreciated that the relative phase $\phi$ between the two diffracted fields $E_t$, $E_b$ from the top and bottom gratings comprises a first phase delay contribution due to the $\phi_{stack}$ and a second phase delay contribution $\phi_{OV}$ due to overlay OV (including any intentional bias $\delta$), i.e., $$\phi = \phi_{OV} + \phi_{stack}$$

The second phase delay contribution $\phi_{OV}$ can be determined from the relative phases $\phi_+$ and $\phi_-$ of the +1 order and the −1 order, respectively by:

$$\phi_+ = \phi_{+1st} - \phi_{+2nd} = \phi_{stack} + \phi_{OV}$$

$$\phi_- = \phi_{-1st} - \phi_{-2nd} = \phi_{stack} - \phi_{OV}$$

where $\phi_{+1st}$ is the phase difference imposed by the first grating and $\phi_{+2nd}$ is the phase difference imposed by the second grating.

Overlay can then be determined from the second phase delay contribution $\phi_{OV}$. Because the relative phases are determined to computationally interfere the first and second electric fields, these relative phase differences $\phi_+$ and $\phi_-$ are known. Therefore, in an embodiment (e.g., where the gratings have the same pitch and measured using illumination having the same illumination characteristics), the method may comprise determining the relative phases $\phi_+$ and $\phi_-$ of the +1 order and the −1 order (or other higher orders) of the interference electric field and using these (e.g., using the equations in the preceding paragraph) to calculate the second phase delay contribution $\phi_{OV}$, and therefore the overlay.

Another method which may be used to determine overlay from the computationally determined interference electric field (e.g., from a pair of grating pairs or targets) is described in the aforementioned patent application EP18158745.2. Such a method describes determining a field asymmetry from the computationally derived description of the interference electric field (e.g., calculating the field difference between the complementary higher orders). In such an embodiment, the target being measured may take the form of known Diffraction Based Overlay (DBO) type compound targets, although it should be appreciated that the concepts described herein are applicable to any scatterometry based metrology using any suitable target design. As such the target may comprise two (sub)targets, or optionally two (sub)targets per direction: i.e., separate pairs of targets for capturing overlay in the x-direction and y-direction, the two targets differing in their deliberate bias $\delta$ imposed between the component gratings. In an embodiment, both targets may have a different imposed bias $\delta_1$, $\delta_2$ For the remainder of the description, however, a proposed target arrangement will comprise a first target with deliberate imposed bias $\delta$ and a second target without any deliberate bias.

In an embodiment, each target is illuminated with spatially coherent radiation. The full field of the +1 and −1 diffraction orders from both gratings $E_+$, $E_-$ and $E_{+\delta}$, $E_{-\delta}$ may be determined coherently (via direct, holographic, and/or via phase retrieval methods). These fields comprise: a first positive higher order diffracted field $E_{+\delta}$, comprising the full field as captured from a positive diffraction order (e.g., +1) diffracted from the first (biased) target, a second positive higher order diffracted field $E_+$ comprising the full field as captured from a positive diffraction order (e.g., +1) diffracted from the second (unbiased) target, a first negative higher order diffracted field $E_{-\delta}$ comprising the full field as captured from a negative diffraction order (e.g., −1) diffracted from the first (biased) target, and a second negative higher order diffracted field $E_-$ comprising the full field as captured from a negative diffraction order (e.g., −1) diffracted from the second (unbiased) target.

In a first embodiment, an algorithm for absolute coherent measurement is proposed. In such an embodiment, only one target and two absolute phase measurements are required. The overlay can be retrieved from a coherent measurement of the +1 and −1 diffraction orders of a single target, provided that the absolute phase shift of the diffraction from the top grating is known (this can be determined, for example, using holography methods). To achieve this, the x and z position of the top grating should be determined with greater accuracy than the desired overlay resolution. The determination of the x position can be derived from an image of the target.

In one such embodiment, the overlay induced phase shift $\phi_{OV}$ can be calculated from:

$$\phi_{OV} = \frac{1}{2}\arg\left(-e^{-i\phi_\delta}\frac{E_+ - E_{+\delta}}{E_- - E_{-\delta}}\right)$$

or from field asymmetry (difference in the electric fields of corresponding diffraction orders):

$$\phi_{OV} = \arctan\left(\frac{\sin\phi_\delta}{\frac{E_+ - E_{+\delta}}{E_- - E_{-\delta}} - \cos\phi_\delta}\right)$$

where the bias induced phase shift $\phi_\delta = 2\pi\delta$. It should be noted that measurement noise may make the angle $\phi_{OV}$ complex. This can be addressed by ensuring that the angle is always real valued.

In a second, fully coherent measurement embodiment, no absolute phase determination is required. Instead, two targets (e.g., as described: a first target with bias $\delta$ and a second target with no bias) are measured and the relative phases between the four diffracted fields $E_-$, $E_{-\delta}$, $E_+$, $E_{+\delta}$ (i.e., the fields relating to each of the +1 and −1 diffraction orders and from each of the targets) are captured. The overlay induced phase shift $\phi_{OV}$ can then be calculated according to the following formula:

$$e^{-i2\phi_{OV}} = \frac{(E_- - E_{-\delta})}{(E_+ - E_{+\delta})}$$

where the bias $\delta$ equals half the grating pitch p ($\delta = p/2$). This specific bias is not a requirement, but simplifies the calculation for the overlay induced phase shift $\phi_{OV}$. This approach may be best suited for metrology arrangements which capture both the +1 and −1 diffraction orders simultaneously; for example, metrology arrangements which use a normal (or near normal) incidence for the measurement beam with respect to the target. For such arrangements, the relative phases between the four fields can be captured relatively simply. Alternatively, the wafer may be rotated to measure both the positive and negative diffraction orders.

The above embodiment can be refined into a partially coherent measurement embodiment, such that only knowledge of the relative phase between diffracted fields relating to the positive diffraction orders $E_+$, $E_{+\delta}$, and of the relative phase between diffracted fields relating to the negative diffraction orders $E_-$, $E_{-\delta}$ are required. This embodiment may be useful, for example, when using a metrology arrangement which uses off-axis illumination, where the measurement beam may be anything up to, e.g., 80 degrees from normal. In such an arrangement, the positive and negative diffraction orders may be captured separately (e.g., in separate acquisitions) and therefore the relative phases between them may not be available. As such, the overlay induced phase shift $\phi_{OV}$ in this embodiment can be retrieved from combinations of fields $E_+$, $E_{+\delta}$ and combinations of fields $E_-$, $E_{-\delta}$ In such an embodiment, for a bias induced phase shift $\phi_\delta = 2\pi\delta$ (where the $\delta$ term is normalized with respect to the grating pitch), the overlay induced phase shift $\phi_{OV}$ can be calculated according to the following formula:

$$e^{-i2\phi_{OV}} = \frac{e^{-i\phi_\delta}\mathrm{sgn}(E_- - e^{-i\phi_\delta}E_{-\delta})\mathrm{sgn}(E_+ - E_{+\delta})}{\mathrm{sgn}([E_- - E_{-\delta}][e^{-i\phi_\delta}E_+ - E_{+\delta}])}$$

where the sign of a complex number z is defined by sgn(z)=z/|z|, and as such has the effect of ensuring that the relative phase between the plus and minus orders is not required.

The calculation can be simplified if an optimized bias $\delta$ is chosen, comprising half the grating pitch p (i.e., $\delta = p/2$). In which case the equation becomes:

$$e^{-i2\phi_{OV}} = \frac{\mathrm{sgn}(E_- - E_{-\delta})\mathrm{sgn}(E_+ - E_{+\delta})}{\mathrm{sgn}([E_- - E_{-\delta}][E_+ - E_{+\delta}])}$$

It will be appreciated that for this partial coherent embodiment, the contrast in the measured images (i.e., on the detector) will be lower than for the fully coherent embodiment. However, the same phase information will be retrieved (or directly measured if using holography). Hence the equations relating to the partially coherent and fully coherent embodiments are the same, except for the normalization aspect for the loss in contrast.

In all the above cases based on determination of the overlay induced phase shift $\phi_{OV}$, the actual overlay OV can be calculated from this overlay induced phase shift $\phi_{OV}$ according to the following equation:

$$OV = \frac{\phi_{OV}}{2\pi}p$$

This overlay may be retrieved modulo the target grating pitch p, as per current DBO methods.

Combining the first and second fields (or fields relating to different overlap regions such as region a and region c in FIG. 7) to calculate the overlay, may further comprise translating the fields and adding an appropriate phase factor. This phase factor $\phi_{trans}$ may be defined as $\phi_{trans} = k_{out} * d_{trans}$ where k-vector $k_{out}$ is associated with the emission angle and $d_{trans}$ is the translation distance.

Presently, the top and bottom gratings require balancing such that the contrast and diffraction efficiency are optimal for measurement. This is because one of the two gratings (e.g., in a first layer) may typically yield a much stronger signal then the other grating (e.g., in a second layer). Therefore, in order to balance the two gratings, the stronger grating may be diminished in some manner, for example by using sub-segmentation. This sub-segmentation is not always favorable for e.g., printability and process robustness. Instead of sub-segmentation, the methods described herein (determining the intensity and phase of the individual gratings, either by direct measurement using holographic techniques or retrieved by means of phase retrieval, and computing the interference), enable the use of gratings having a form optimized for providing the strongest and/or most robust signals for the individual layers, without being concerned with optimizing contrast. Optimal contrast can then be obtained by (subsequently) scaling one of the electric fields when computationally determining the interference.

Normally overlay targets are measured using radiation having one or multiple wavelengths/polarizations, with each measurement individually analyzed and the results combined. For some structures, such as e.g. 3D X-point (a form of restive RAM where storage is based on a change of bulk resistance, in conjunction with a stackable cross-gridded data access array), the layers between the two gratings may be very opaque (at least to the visible or near infra-red part of the spectrum, e.g., 400-1000 nm) and longer measurement wavelengths (e.g., >1000 nm) may instead have to be used. The signal from the top grating (which is a grating in resist) will become progressively weaker with increasing wavelength. It would be desirable to better balance measurement of the two gratings making up such a target.

The computational interference techniques disclosed herein enable the possibility of optimizing the illuminating radiation and grating pitch to maximize the captured signal strength for each grating; e.g., using a first wavelength $\lambda 1$ to measure the first (bottom) structure having first pitch P1 and a second wavelength $\lambda 2$ to measure the second (top) structure having second pitch P2. For example, a more convention (smaller) pitch P2 and second wavelength $\lambda 2$ can be used to measure the top (second) grating. Second wavelength $\lambda 2$ may be, for example, a visible or (near) infra-red wavelength, more specifically in the range 400-1000 nm, more specifically still in the region of 700 nm. In an embodiment, the pitch P2 may be similar or the same as the wavelength $\lambda 2$ used to measure it (i.e., P2$\lambda 2$). The use of such a conventional wavelength will mean that the illuminating radiation will not penetrate the opaque layers and therefore the bottom grating will not be measured; however it can be optimized for the top grating. The bottom (first) grating can be measured with a first, longer, wavelength $\lambda 1$ (e.g., >1000 nm, more specifically such that $\lambda 1=2\lambda 2$; or 1400 nm in the specific example given) enabling it to penetrate the opaque layers. To capture the diffraction orders, the pitch P1 of the bottom grating may be such that P1=$\lambda 1$=2P2. When using this first wavelength radiation, the diffraction from the top grating will not be captured. As with the other embodiments disclosed herein, each of the measurements of the top and bottom gratings is made using computational or holographic techniques to capture intensity and phase, with the interference of their respective fields determined computationally to obtain an overlay value. As with the previous embodiment, a scaling may be applied to one of the electric fields to optimize contrast.

It should be noted that this embodiment should comprise a phase and transmission calibration for the computational imaging sensor between the first and second wavelengths $\lambda 1$ and $\lambda 2$. This could be done by measuring one or more gratings with multiple wavelengths and then combining the obtained information to determine the amplitude and phase relation of the computational imaging sensor between wavelengths $\lambda 1$ and $\lambda 2$. In this manner, the computational imaging sensor can be seen to operate similarly to a (local) alignment sensor, relating the relative position between the top and bottom gratings using the two (different) wavelengths $\lambda 1$ and $\lambda 2$.

In another embodiment, a hybrid approach may be employed, whereby regions of the acquired image corresponding to radiation having been scattered by both gratings, and therefore subject to actual interference, can be processed using conventional techniques based on the actual interference intensities as sensed, in combination with the computational interfering of the sensed radiation scattered by each of the single gratings using the methods disclosed herein. Such a method may comprise using conventional techniques to calculate a first overlay value from measured intensities of radiation scattered by both gratings having undergone actual interference, and a second overlay value from the computationally determined interference electric field as described. In such a method, one overlay value can act as a check for the other, or else the first and second overlay values can be averaged, and the averaged overlay value used as the final overlay value. Optionally, a weighing may be applied when averaging, so as to optimize the resulting signal-to-noise ratio of the resulting final overlay value. For example, preference/priority may be given to the measurement that has the better signal-to-noise ratio.

Any method for measuring or extracting the required relative (or absolute) phases may be used in the above methods. A few example measurement schemes will now be described, by way of example. In each case, spatially (partial) coherent illumination should be used.

A computational imaging/phase retrieval approach may be employed. In such an approach, the intensity and phase of the target is retrieved from one or multiple intensity measurements of the target. The phase retrieval may use prior information of the metrology target (e.g., for inclusion in a loss function that forms the starting point to derive/ design the phase retrieval algorithm). Alternatively, or in combination with the prior information approach, diversity measurements may be made. To achieve diversity, the imaging system is slightly altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements.

The phase retrieval arrangement is required to determine the relative phase between the two targets. In general, phase retrieval does not necessarily guarantee this. For example, this is not typically possible from only a single measurement at best focus, because there is insufficient information. Sufficient information can be obtained when the fields emitted by both targets interfere; however when in-focus, diffraction orders from each target tend to be narrow and therefore do not interfere with diffraction orders from the other target. Therefore, to ensure that the phase relationship of the two targets are sufficiently well-defined, methods such as those described above to ensure the phase relationship is sufficiently well-defined between the first and second gratings can be employed. In this way, the phase relationship between the two gratings of each target, and between the two targets of an (e.g., DBO-type) compound target, will be sufficiently well-defined.

The phase retrieval itself may be based on aforementioned patent application EP17199764. This describes determining from an intensity measurement, a corresponding phase retrieval such that interaction of the target and the illumination radiation is described in terms of its electric field (amplitude and phase). The intensity measurement may be of lower quality than that used in conventional metrology, and therefore may be out-of-focus as described. The described interaction may comprise a representation of the electric and/or magnetic field immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion, although the location of the model plane is not critical: once amplitude and phase at one plane are known, they can be computationally propagated to any other plane (in focus, out of focus, or even the pupil plane). Alternatively, the description may comprise a complex transmission of the target or a two-dimensional equivalent thereof.

The phase retrieval may comprise modeling the effect of interaction between the illumination radiation and the target on the diffracted radiation to obtain a modelled intensity pattern; and optimizing the phase and amplitude of the electric field within the model so as to minimize the difference between the modelled intensity pattern and the detected intensity pattern. More specifically, during a measurement acquisition, an image (e.g., of a target) is captured on detector (at a detection plane) and its intensity measured. A phase retrieval algorithm is used to determine the amplitude and phase of the electric field at a plane for example parallel with the target (e.g., immediately above the target). The phase retrieval algorithm uses a forward model of the sensor (e.g. aberrations are taken into account), to computationally image the target to obtain modelled values for intensity and phase of the field at the detection plane. No target model is required. The difference between the modelled intensity values and detected intensity values is minimized in terms of phase and amplitude (e.g., iteratively) and the resultant corresponding modelled phase value is deemed to be the retrieved phase.

The required information for retrieving the phase may come from the diversity (multiple diverse measurements or images). Alternatively, or in combination, prior (target) knowledge may be used to constrain the phase retrieval algorithm. The prior knowledge, for example, may be included in a loss function that forms the starting point to derive/design the phase retrieval algorithm. In such an embodiment, the prior knowledge may be based on certain observations; for example there is much regularity between each image of the multiple images of the target. The multiple images may be obtained in a single measurement (e.g., a measurement using more than one illumination condition. e.g., a multi-wavelength measurement) or from the diversity measurements (different focus levels etc.) already described. It can be observed that, for each image, the target comprises essentially a similar form. In particular, each obtained target image has the same or a very similar position and shape for each region of interest. For example, where the target is a x and y direction compound target, having a general form of a presently used DBO target, each image will generally comprise a region of relatively high intensity having a relatively flat intensity profile corresponding to the position of each target making up the compound target (e.g., a relatively flat intensity profile in each quadrant of a larger square pattern). This similarity between images may be exploited, for example, by means of a generalization of a Total Variation or Vector Total Variation regularization (i.e., imposing an L1 penalty on the gradient of the target image). A benefit of this vector generalization is that it introduces a coupling between e.g., different illumination conditions.

It should be clear that diversity, prior target knowledge or both may be used in the phase retrieval. With sufficient diversity, it should not be necessary to impose a constraint based on prior target knowledge to ensure convergence. Equally, by constraining the phase retrieval algorithm using prior target knowledge, diversity (e.g., measurement at different levels of defocus) should not be necessary. Greater accuracy or better guarantee of convergence may be obtained by using both diversity and imposing a prior target knowledge constraint. The metrology apparatus for performing such a method may, for example, take the form of that illustrated in FIG. 5(a). However, this is purely illustrative and any suitable scatterometry based metrology device may be used.

For thick stacks, the distance between the top grating and bottom grating may be large (i.e., large compared to the depth of focus, e.g., the Rayleigh criterion for depth of focus). It is proposed here that each of the two electric fields which are to be interfered, are defined at their respective best and/or optimal focus; e.g., a first electric field, located on a first plane at a z-level which corresponds with the location of the bottom grating, is defined at a best focus for the first plane, and a second electric field, located on a second plane at a z-level which corresponds with the location of the top grating, is defined at a best and/or optimal focus for the second plane. Similarly, if there are more than two gratings, all gratings can be defined at their optimal and/or best focus for their respective z-levels. Optimal focus may be best focus (i.e., sharpest focus), or may be another optimal focus taking into account considerations in addition to or other than sharpness (e.g., process variation robustness). The aforementioned patent applications EP17194905.0, EP17199764.6 and EP17206967.6 describe an algorithm (e.g., a prior knowledge algorithm such as an L1 norm) which can be used to calculate complex fields at different levels of depth/focus levels, and possible reimaging techniques.

Defining the electric field at target level on two different planes, as described, results in a doubling of the amount of unknowns. The described prior knowledge phase retrieval techniques, such as the L1 norm which favors a sharpening of each image, can be used to solve all of the unknowns. The advantage of this is that the first and second electric fields of each of two gratings can be independently characterized at their respective best focus positions. These first and second electric fields can then be computationally interfered using the methods described, e.g., to infer overlay. An advantage of being in best focus is that the influence of neighboring product structures is minimized (as the point spread function is most compact at best focus). Hence the described dual focus approach may lead to an improved process robustness.

As an alternative to computationally retrieving phase, the necessary phase information may be extracted using a digital holographic microscopy arrangement. In such an arrangement, a known reference field (e.g., from a reference laser beam) is combined coherently on the sensor with the object field from diffraction orders +1, −1 (diffracted from each grating). The measured intensity from the combined fields (e.g., from additional fringes on the sensor) is decomposed into the reference and object field, e.g., using a suitable computer algorithm. This naturally provides the intensity and phase of the object field, from which the phase relation between the diffraction orders from each grating is obtained. Digital holographic microscopy allows phase to be determined from a single measurement without any prior target knowledge, and even enables absolute phase measurements to be made.

While the above examples are described in terms of overlay, the invention is equally applicable to any metrology based on measuring asymmetry in a structure, such as a target, comprising (at least) two gratings. While overlay is one example of a characteristic of interest which can be measured in this way, other examples may comprise focus and/or dose. These can be measured, for example, from targets which are exposed with a focus or dose dependent asymmetry which can be measured back and the exposure focus position and/or dose determined therefrom. Another example of a characteristic of interest for which the concepts herein are applicable is EPE (Edge Placement Error), which is a more complex form of overlay (e.g., a combination of overlay and critical dimension uniformity).

Further embodiments are disclosed in the subsequent numbered clauses:

1. A method for obtaining a computationally determined interference electric field describing scattering of radiation by a pair of structures comprising a first structure and a second structure on a substrate, the method comprising:

determining a first electric field relating to first radiation scattered by the first structure;
determining a second electric field relating to second radiation scattered by the second structure; and
computationally determining the interference of the first electric field and second electric field, to obtain a computationally determined interference electric field.
2. A method as defined in clause 1, wherein said computationally determining step comprises combining the first electric field and second electric field.
3. A method as defined in clause 2, wherein said combining the first electric field and second electric field comprises summing the first electric field and second electric field.
4. A method as defined in clause 1, wherein said computationally determining step comprises modelling their interference using a scattering model, or an inverse scattering model, of the first electric field and second electric field.
5. A method as defined in any preceding clause, wherein the method comprises: performing intensity measurements of said first radiation and second radiation; and determining phase information relating to said first radiation and second radiation.
6. A method as defined in clause 5, wherein said phase information comprises at least the relative phase between the first radiation and second radiation.
7. A method as defined in clause 5 or 6, wherein said intensity measurements comprise intensity measurements of higher diffraction orders of said first radiation and second radiation, and said determining phase information comprises performing a phase retrieval determination from said intensity measurements.
8. A method as defined in clause 7, wherein said phase retrieval comprises performing, for each of the first structure and second structure:
modeling the effect of interaction between incident illuminating radiation and the structure on the scattered radiation to obtain modeled values for phase and intensity at a detection plane; and
optimizing the phase and intensity of the corresponding one of the first electric field or second electric field as modeled, so as to minimize the difference between the modeled intensity and the intensity measurements as detected.
9. A method as defined in clause 5, wherein said determining phase information comprises performing a holographic microscopy measurement of higher diffraction orders of said first radiation and second radiation, based on a known reference field.
10. A method as defined in any of clauses 5 to 9, comprising performing a relative scaling of at least the first electric field or second electric field to optimize contrast when computationally determining the interference.
11. A method as defined in any of clauses 5 to 10, wherein the first structure and second structure each have a form optimized for signal strength and or signal robustness of said first radiation and second radiation respectively.
12. A method as defined in clause 10, wherein a first incident illuminating radiation having a first wavelength optimized for signal strength and/or signal robustness of said first radiation is used to illuminate the first structure to obtain said first radiation, and a second incident illuminating radiation having a second wavelength optimized for signal strength and/or signal robustness of said second radiation is used to illuminate the second structure to obtain said second radiation.
13. A method as defined in clause 12, wherein there are one or more opaque layers between said first structure and second structure, said one or more opaque layers being opaque to said second wavelength, and wherein said first wavelength is sufficiently long to penetrate said one or more opaque layers.
14. A method as defined in clause 12 or 13, wherein said first wavelength is twice the second wavelength and a pitch of the first structure is twice the pitch of the second structure.
15. A method as defined in clause 12, 13 or 14, comprising performing a phase and transmission calibration to calibrate sensing between said first incident illuminating radiation having said first wavelength and said second incident illuminating radiation having said second wavelength.
16. A method as defined in any preceding clause, wherein at least said first electric field and said second electric field are each determined for corresponding respective best and/or optimal focus positions.
17. A method as defined in any preceding clause, wherein at least a portion of the first radiation and at least or portion of said second radiation are detected separately.
18. A method as defined in any preceding clause, wherein the first structure and second structure at least partially overlap in the direction of incident illuminating radiation.
19. A method as defined in clause 18, wherein one of the first structure and second structure is larger than the other and/or offset relative to the other, so as to enable capture of intensity measurements of said first radiation and second radiation in a single acquisition.
20. A method as defined in any of clauses 1 to 17, wherein said first structure and said second structure do not overlap in the direction of incident illuminating radiation, and their separation distance in a plane of the substrate is not greater than the spatial coherence length of incident illuminating radiation used to illuminate the pair of structures to obtain said first radiation and second radiation.
21. A method as defined in any of clauses 1 to 17, wherein said first structure and said second structure do not overlap in the direction of incident illuminating radiation, and their separation distance in a plane parallel to the substrate is greater than the spatial coherence length of incidence radiation used to illuminate the pair of structures to obtain said first radiation and second radiation, said substrate comprising one or more auxiliary reference structures between said first structure and said second structure such that the separation between adjacent structures of said first structure, said second structure and said one or more auxiliary reference structures is not greater than the spatial coherence length of incidence radiation used to illuminate the pair of structures to obtain said first radiation and second radiation.
22. A method as defined in any preceding clause, wherein said first structure and second structure are comprised in different layers on said substrate.
23. A method as defined in any of clauses 1 to 21, wherein said first structure and second structure are comprised in the same layer on said substrate, and said pair of structures forms a stitched target for measuring relative alignment of adjacent sub-fields of a stitched die.

24. A method as defined in any preceding clause, wherein said first electric field, second electric field and computationally determined interference electric field are described in terms of intensity and phase.
25. A method as defined in clause 24, wherein said first electric field, second electric field and computationally determined interference electric field are described additionally in terms of one or more of polarization, temporal coherence and spatial coherence.
26. A method as defined in any preceding clause, comprising determining a characteristic of interest relating to the pair of structures from said computationally determined interference electric field.
27. A method as defined in clause 26, wherein said characteristic of interest comprises overlay which describes a relative lateral displacement between the first structure and second structure.
28. A method as defined in clause 26 or 27, wherein said characteristic of interest is determined from the asymmetry in at least intensities of corresponding higher diffraction orders of said computationally determined interference electric field as computationally determined from one or more of said pairs of structures.
29. A method as defined in clause 26, 27, or 28, wherein said method comprises:
   determining a characteristic of interest induced phase change contribution of said computationally determined interference electric field; and
   determining said characteristic of interest from said characteristic of interest induced phase change.
30. A method as defined in clause 29, wherein said characteristic of interest induced phase change is determined from the relative phase differences of corresponding higher diffraction orders of said computationally determined interference electric field as computationally determined from one or more of said pairs of structures.
31. A method as defined in clause 29, wherein said characteristic of interest induced phase change is determined from asymmetry in the electric fields of corresponding higher diffraction orders of said computationally determined interference electric field as computationally determined from one or more of said pairs of structures.
32 A method as defined in clause 29, wherein said characteristic of interest induced phase change is determined from the difference of a first computationally determined electric field corresponding to a first target and a second computationally determined electric field corresponding to a second target, for each of two corresponding higher diffraction orders; wherein there is a relative bias difference between said first target and said second target.
33. A method as defined in any of clauses 26 to 32, comprising determining a first characteristic of interest value from said computationally determined interference electric field and determining a second characteristic of interest value from a corresponding sensed interference electric field resulting from actual interference of said first electric field and said second electric field; and combining the first characteristic of interest value and the second characteristic of interest value to obtain a final characteristic of interest value.
34. A non-transitory computer program product comprising machine-readable instructions for causing a processor to cause performance of the method as defined in any preceding clause.
35. A processing apparatus comprising machine-readable instructions for causing the processing device to cause performance of the method as defined in any of clauses 1 to 33.
36. An inspection apparatus comprising the processing apparatus of clause 35.
37. The inspection apparatus as defined in clause 36, further comprising:
   a substrate holder for holding a substrate comprising said first structure and said second structure,
   projection optics for projecting illuminating radiation onto first structure and said second structure;
   a detector for detecting said first radiation and said second radiation resultant from said illuminating radiation having been scattered by said first structure and said second structure.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for using radiation scattered by a pair of structures comprising a first grating structure and a second grating structure, both disposed on a substrate, to yield a characteristic of interest, the method comprising:
   determining a first electric field relating to first radiation scattered by the first grating structure;
   determining a second electric field relating to second radiation scattered by the second grating structure; and
   using the determined first and second electric fields to determine the characteristic of interest relating to the pair of structures.

2. The method of claim 1, wherein the determined characteristic of interest comprises overlay that describes a relative lateral displacement between the first grating structure and second grating structure.

3. The method of claim 1, wherein the method comprises:
   performing intensity measurements of the first radiation and second radiation; and
   determining phase information relating to the first radiation and second radiation,
   wherein the phase information comprises at least a relative phase between the first radiation and second radiation.

4. The method of claim 3, wherein:
   the intensity measurements comprise intensity measurements of higher diffraction orders of the first radiation and second radiation, and
   the determining phase information comprises performing a phase retrieval determination from the intensity measurements.

5. The method of claim 4, wherein the phase retrieval comprises, for each of the first grating structure and second grating structure:
   modeling the effect of interaction between incident illuminating radiation and the grating structure on the scattered radiation to obtain modeled values for phase and intensity at a detection plane; and
   optimizing the phase and intensity of the corresponding one of the first electric field or second electric field as modeled, so as to minimize a difference between the modeled intensity and the intensity measurements as detected.

6. The method of claim 3, wherein the determining phase information comprises performing a holographic microscopy measurement of higher diffraction orders of the first radiation and second radiation, based on a known reference field.

7. The method of claim 1, further comprising computationally determining an interference of the first electric field and second electric field to determine the characteristic of interest.

8. The method of claim 7, wherein the computationally determining comprises modeling their interference using a scattering model or an inverse scattering model of the first electric field and second electric field.

9. The method of claim 7, further comprising:
   determining a first characteristic of interest value from the computationally determined interference electric field;
   determining a second characteristic of interest value from a corresponding sensed interference electric field resulting from actual interference of the first electric field and the second electric field; and
   combining the first characteristic of interest value and the second characteristic of interest value to obtain a final characteristic of interest value.

10. The method of claim 7, wherein the computationally determining comprises combining the first electric field and second electric field, and
   the combining the first electric field and second electric field comprises summing the first electric field and second electric field.

11. The method of claim 1, wherein at least a portion of the first radiation and at least a portion of the second radiation are detected separately.

12. The method of claim 1, wherein:
   the first grating structure and second grating structure at least partially overlap in a direction of incident illuminating radiation, and
   one of the first grating structure and second grating structure is larger than the other and/or offset relative to the other, so as to enable capture of intensity measurements of the first radiation and second radiation in a single acquisition.

13. The method of claim 1, wherein one of:
   the first grating structure and the second grating structure do not overlap in a direction of incident illuminating radiation, and a separation distance between both in a plane of the substrate is not greater than a spatial coherence length of incidence radiation used to illuminate the pair of structures to obtain the first radiation and second radiation,
   the first grating structure and the second grating structure do not overlap in the direction of incident illuminating radiation, and their separation distance in a plane parallel to the substrate is greater than the spatial coherence length of incidence radiation used to illuminate the pair of structures to obtain the first radiation and second radiation, or
   the substrate comprises one or more auxiliary reference structures between the first grating structure and the second grating structure such that the separation between adjacent structures of the first grating structure, the second grating structure, and the one or more auxiliary reference structures is not greater than the spatial coherence length of incidence radiation used to illuminate the pair of structures to obtain the first radiation and second radiation.

14. A system to determine a characteristic of interest of a substrate, the system comprising:
   an illumination system configured to direct radiation at a pair of structures comprising a first grating structure and a second grating structure, both disposed on the substrate;
   a measurement system configured to receive radiation scattered by the first and second gratings and output signals corresponding thereto;
   a controller configured to:
      receive the signals;
      determine a first electric field relating to first radiation scattered by the first grating structure;
      determine a second electric field relating to second radiation scattered by the second grating structure; and
      determine the characteristic of interest relating to the pair of structures using the determined first and second electric fields.

15. The system of claim 14, wherein the determined characteristic of interest comprises overlay that describes a relative lateral displacement between the first grating structure and second grating structure.

16. The system of claim 14, wherein the controller is further configured to:
perform intensity measurements of the first radiation and second radiation; and
determine phase information relating to the first radiation and second radiation,
wherein the phase information comprises at least a relative phase between the first radiation and second radiation.

17. The system of claim 16, wherein:
the intensity measurements comprise intensity measurements of higher diffraction orders of the first radiation and second radiation, and
the phase information comprises a phase retrieval determination from the intensity measurements.

18. The system of claim 17, wherein using the phase retrieval performed for each of the first grating structure and second grating structure, the controller:

models the effect of interaction between incident illuminating radiation and the grating structure on the scattered radiation to obtain modeled values for phase and intensity at a detection plane; and optimizes the phase and intensity of the corresponding one of the first electric field or second electric field as modeled, so as to minimize a difference between the modeled intensity and the intensity measurements as detected.

19. The system of claim 16, wherein the determined phase information comprises a holographic microscopy measurement of higher diffraction orders of the first radiation and second radiation, based on a known reference field.

20. The system of claim 14, wherein at least a portion of the first radiation and at least a portion of the second radiation are detected separately.

* * * * *